(12) United States Patent  (10) Patent No.: US 6,549,459 B2
Higuchi                    (45) Date of Patent: Apr. 15, 2003

(54) METHOD OF MANAGING A DEFECT IN A FLASH MEMORY

(75) Inventor: Yoshinobu Higuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/978,014

(22) Filed: Oct. 17, 2001

(65) Prior Publication Data
US 2002/0048202 A1 Apr. 25, 2002

(30) Foreign Application Priority Data
Oct. 25, 2000 (JP) ....................................... 2000-325024

(51) Int. Cl.$^7$ ............................................. G11C 16/06
(52) U.S. Cl. .................... 365/185.09; 365/200; 365/218
(58) Field of Search ........................... 365/185.09, 200, 365/218

(56) References Cited

U.S. PATENT DOCUMENTS

| | | | | |
|---|---|---|---|---|
| 5,438,573 A | * | 8/1995 | Mangan et al. ............. | 714/701 |
| 5,954,828 A | * | 9/1999 | Lin ............................. | 365/201 |
| 6,014,755 A | * | 1/2000 | Wells et al. ................. | 365/218 |
| 6,185,134 B1 | * | 2/2001 | Tanaka .................... | 365/185.33 |
| 6,414,876 B1 | * | 7/2002 | Harari et al. .......... | 365/185.22 |

FOREIGN PATENT DOCUMENTS

| | | |
|---|---|---|
| JP | HEI 6-203591 A | 7/1994 |
| JP | HEI 8-031196 A | 2/1996 |
| JP | HEI 11-203892 A | 7/1999 |

* cited by examiner

Primary Examiner—David Nelms
Assistant Examiner—Tu-Tu Ho
(74) Attorney, Agent, or Firm—Arent Fox Kintner Plotkin & Kahn, PLLC

(57) ABSTRACT

In a flash memory, error management units which store information on a physical occurrence position of an error which occurred during data reading are prepared by as much as the number of bits which can be corrected by an error correction code, in a redundant portion of a physical page. If the number of positions on which the error have occurred in a same physical page exceeds the number of the prepared error management units, then it is judged that the defect is uncorrectable.

5 Claims, 6 Drawing Sheets

FIG.6

| ZONE NUMBER | 0 | | 1 | | 2 | | 3 | | 4 | | 5 | |
|---|---|---|---|---|---|---|---|---|---|---|---|---|
| CELL POSITION | 0 | | 1 | | 2 | | 3 | | 4 | | 5 | |
| BIT POSITION | 0 | 1 | 2 | 3 | 4 | 5 | 6 | 7 | 8 | 9 | 10 | 11 |
| DEFECT EXAMPLE 1 | X | X | | | | | | | | | | |
| DEFECT EXAMPLE 2 | | X | X | | | | | | | | | |

METHOD OF MANAGING A DEFECT IN A FLASH MEMORY

FIELD OF THE INVENTION

The present invention relates to a method of managing a defect in a flash memory that can store 1-bit or multi-bit information in a single memory cell.

BACKGROUND OF THE INVENTION

A storage device using a flash memory, which can be electrically erased at once and/or which is a rewritable read-only memory, is employed in portable information equipments, digital cameras or the like. Normally, a storage device using a flash memory, especially an NAND type flash memory, adopts error correction mechanism and registers management information of physical pages. It is judged whether or not a physical block can be used based on the registered management information. The physical page is a minimum unit for programming or reading data. The physical block is a minimum unit for erasing data. The physical block consists of multi physical pages.

The correlation between the physical page and the physical block is shown in FIG. 1. A plurality of bit lines BL (for example, 4224 in number) are connected to a page buffer 101 for programming or reading data. A plurality of word lines WL are connected to a decoder 102. The bit lines BL and the word lines WL are provided in a matrix form. One memory cell 103 is provided at an intersection of every bit line BL and the word line WL. The physical page is a collection of a plurality of memory cells 103 on an arbitrary word line WL. The physical page is a minimum unit for programming or reading data. Accordingly, if the number of bit lines BL is 4224, then a data capacity of the physical page will be 4224 bits.

The physical block is a collection of a plurality of memory cells 103 on a plurality of word lines WL (for example, 8 or 16 in number) between select gates. The physical block is a unit for erasing data. Accordingly, the physical block is a collection of a plurality of physical pages (for example, 8 or 16 in number). If the number of bit lines BL is 4224 and that of word lines WL is 8, then a data capacity of the physical block will be 33792 (i.e. 4224 ×8) bits.

Conventionally, the storage device using a flash memory stores information such as how may times the data was erased or how may times programming was performed. The number of times a stress is applied to a memory cell, due to erasing or programming of data, is used as a standard to decided whether to prohibit the use of a physical block. Moreover, a physical block that includes a physical page to which an error has actually occurred is not allowed to be used.

However, if the number of times for which a stress is applied to a memory cell or occurrence of error is used as a standard for deciding whether to prohibit use, there is a possibility that the use of a certain physical block including a physical page is prohibited even if the physical page can be used sufficiently continuously by utilizing an error correction function adopting an error correction code.

Assume, for example, a memory device having a function to correct 2-bit errors per physical page. This memory device can make error correction even if 2-bit error occurs to a physical page at the time of data reading, and it is possible to accurately obtain data from this memory device. Thus, the physical block including the physical page can be sufficiently used even if the error has occurred. However, conventionally, such a physical block is prohibited from use.

Moreover, recently attention is being paid to a multi valued cell which can store multi-bit data. Assume, for example, that an error has occurred in multi-bits in one physical page in a flash memory consisting of such multi valued cells. In this case, it is necessary to judge whether the bits to which the error has occurred are bits stored in a single cell or they spread over multi cells.

Assume that a storage device can store 2-bit data in a certain physical page and that it can correct 2-bit error per physical page. In this case, if 2-bit error occurred to a certain physical page and, especially, if the error occurred to 2 bits stored in the same memory cell in the physical page, then the error can be sufficiently corrected.

In addition, even if that memory cell degrades in the future, error may occur only to the 2 bits unless a new error occurs to a different bit (or different bits) in the memory cell in the same physical page. Therefore, it is not necessary to prohibit the use of a physical block including the physical page to which the 2-bit error has occurred.

On the other hand, if a 1-bit error occurs to each of two memory cells in the same physical page, there is a high probability that the two memory cells to which the error has occurred will degrade in the future and that a maximum of 4-bit error may occur. If 3-bit or 4-bit error occurs to the same physical page, it is impossible to correct the error. In this case, therefore, it is necessary to prohibit the use of the physical block including the physical page to which the 2-bit error has occurred. In case of a multi valued cell, it is impossible to accurately judge whether or not a physical block can be used unless strict consideration is given to the positions of a plurality of bits to which the error has occurred.

SUMMARY OF THE INVENTION

It is an object of this invention to provide a method of managing a defect in a flash memory capable of accurately judging whether or not a physical block can be used based on the position of a memory cell to which an error has occurred, and an error correction capability.

The method, of managing a defect in a flash memory that stores 1-bit information in a single cell, according to one aspect of this invention comprises the steps of: deciding whether an error has occurred, and if the error has occurred, deciding a number of errors occurring in a one physical page; deciding whether a number of memory cells corresponding to a plurality of bits to which the error has occurred in the one physical page exceeds a predetermined number that is equal to or smaller than the number of bits which can be corrected using an error correction code; and prohibiting use of a physical block including the one physical page for which it is decided that the number of memory cells exceeds the predetermined number.

According to the above-mentioned aspect, if the number of errors which have occurred in the same physical page exceeds a range which can be corrected using the error correction code, then it is judged that an uncorrectable error occurred, and the use of a physical block including such a physical page is prohibited. Thus, according to the present invention, it becomes possible to judge more accurately whether or not the physical block can be used.

The method, of managing a defect in a flash memory that stores multi-bit information in a single cell, according to another aspect of this invention comprises the steps of: deciding whether an error has occurred, and if the error has occurred, deciding a number of errors occurring in a one physical page; deciding whether a total number of bits included in memory cells corresponding to multi-bits to which the error has occurred in the physical page exceeds a predetermined number that is equal to or smaller than the number of bits which can be corrected using an error correction code; and prohibiting use of a physical block including the physical page for which it is decided that the number of memory cells exceeds the predetermined number.

According to the above-mentioned aspect, in case of a flash memory consisting multi valued cells, if a total number of bits included in a memory cell corresponding to an error which has occurred in the same physical page exceeds a range which can be corrected using the error correction code, then it is judged that an uncorrectable error has occurred, and the use of a physical block including such a physical page is prohibited. Because, if the number of errors exceeds the range which can be corrected by the error correction code, then there is a high probability that error will occur in the future. Thus, according to the present invention, it becomes possible to judge more accurately whether or not the physical block can be used.

Other objects and features of this invention will become apparent from the following description with reference to the accompanying drawings.

BRIEF DESCRIPTION OF THE DRAWINGS

FIG. 6 is a view for describing a case where the method of managing a defect in a flash memory according to the present invention is applied to a flash memory consisting of multi valued cells.

DESCRIPTION OF THE PREFERRED EMBODIMENTS

Embodiments of the present invention will be described hereinafter in detail with reference to accompanying FIG. 2 to FIG. 6.

Figure 1:
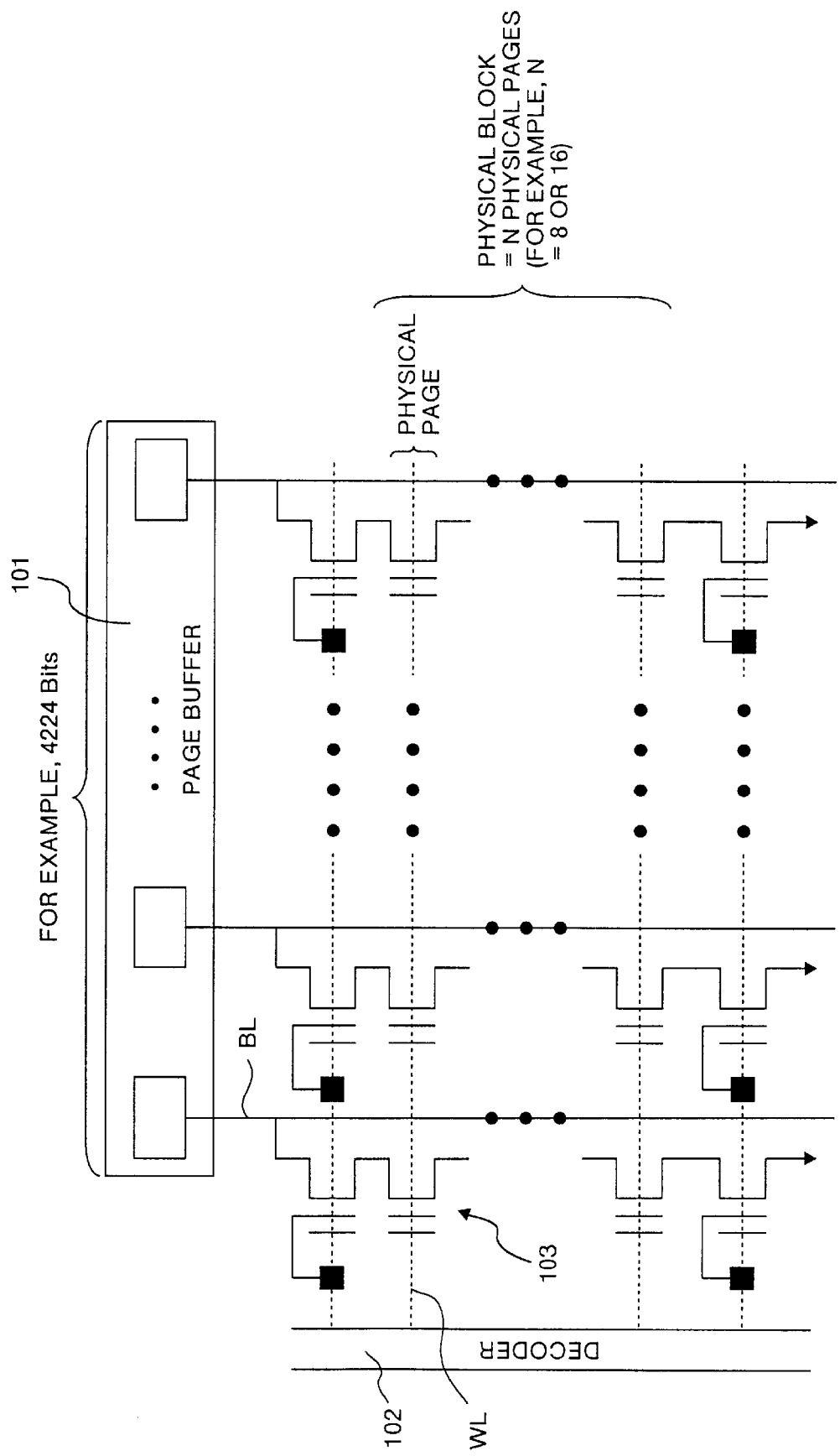
FIG. 1 is an explanatory view showing the correlation between a physical page and a physical block.
Figure 2:
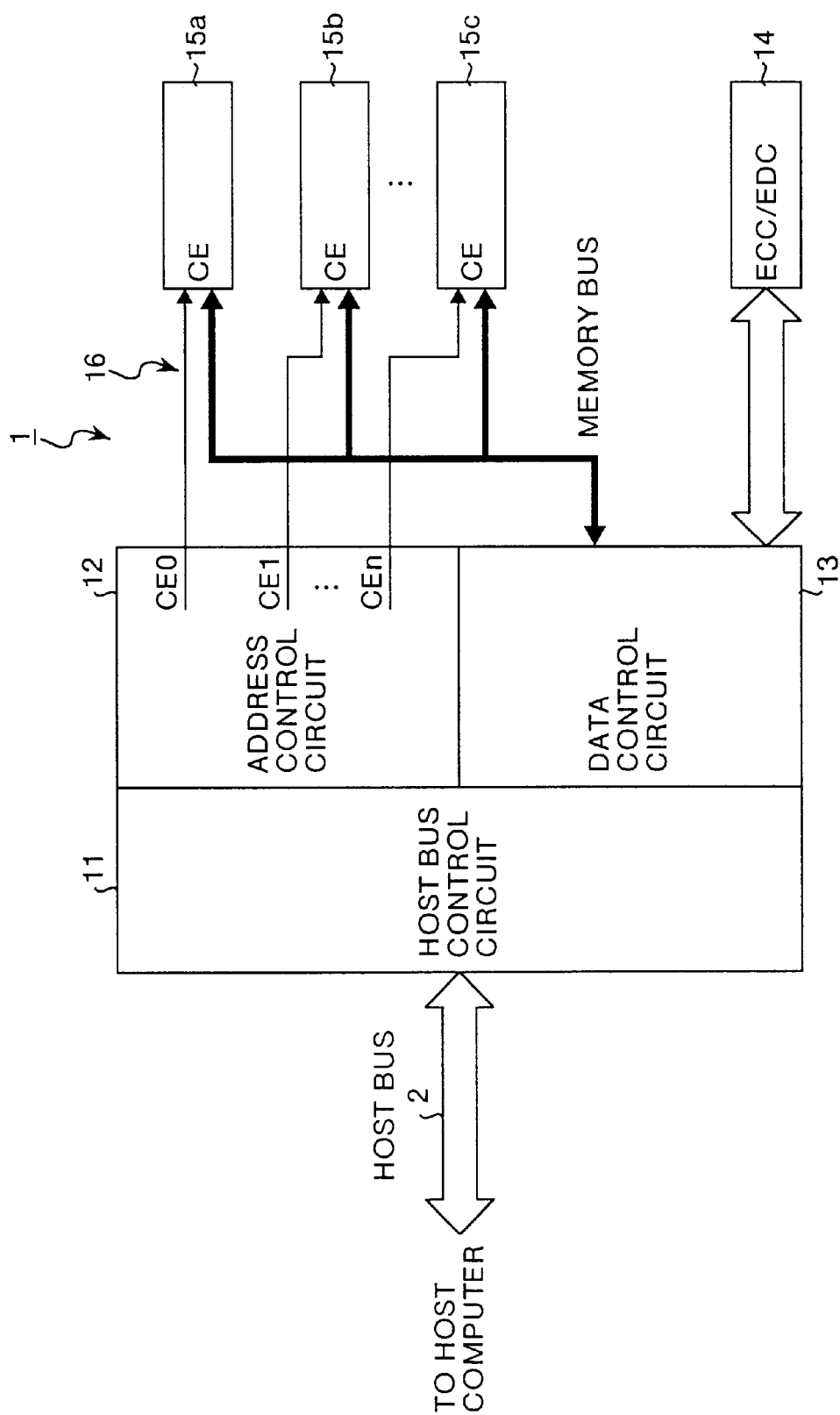
FIG. 2 is a block diagram showing one example of the constitution of a storage device to which a method of managing a defect in a flash memory according to the present invention is applied.

FIG. 2 is a block diagram showing one example of the constitution of a storage device to which a method of managing a defect in a flash memory according to the present invention is applied. This storage device 1 comprises a host bus control circuit 11, an address control circuit 12, a data control circuit 13, an error correction code generation circuit (ECC/EDC) 14 and flash memories 15a, 15b and 15c. Although a plurality of flash memories are shown in this figure, one flash memory is sufficient. The communication of signals among the address control circuit 12, the data control circuit 13, the flash memories 15a, 15b and 15c and the error correction code generation circuit 14 is performed using a memory bus 16.

The error correction code generation circuit 14 generates an error correction code corresponding to data stored in a physical page during programming. The error correction code is registered, together with actual data, in a management information storage area prepared in a redundant portion of the physical page. An explanation about the management information storage area will be given later.

The data control circuit 13 controls the error correction code generation circuit 14 to generate an error correction code (to be referred to as "a comparison target code" hereinafter) with respect to data read from, for example, the flash memory 15a. When data is read, the data control circuit 13 compares the comparison target code of the read data with the error correction code stored as management information during programming and thereby checks whether or not there is an error. If there is an error, the data control circuit 13 judges whether or not the error is correctable, and whether or not a physical page to which the error is present is usable. The result of such a judgment is fed to a not shown host computer through the host bus control circuit 11 and a host bus 2. The host computer my be any conventionally known computer.

Figure 3:
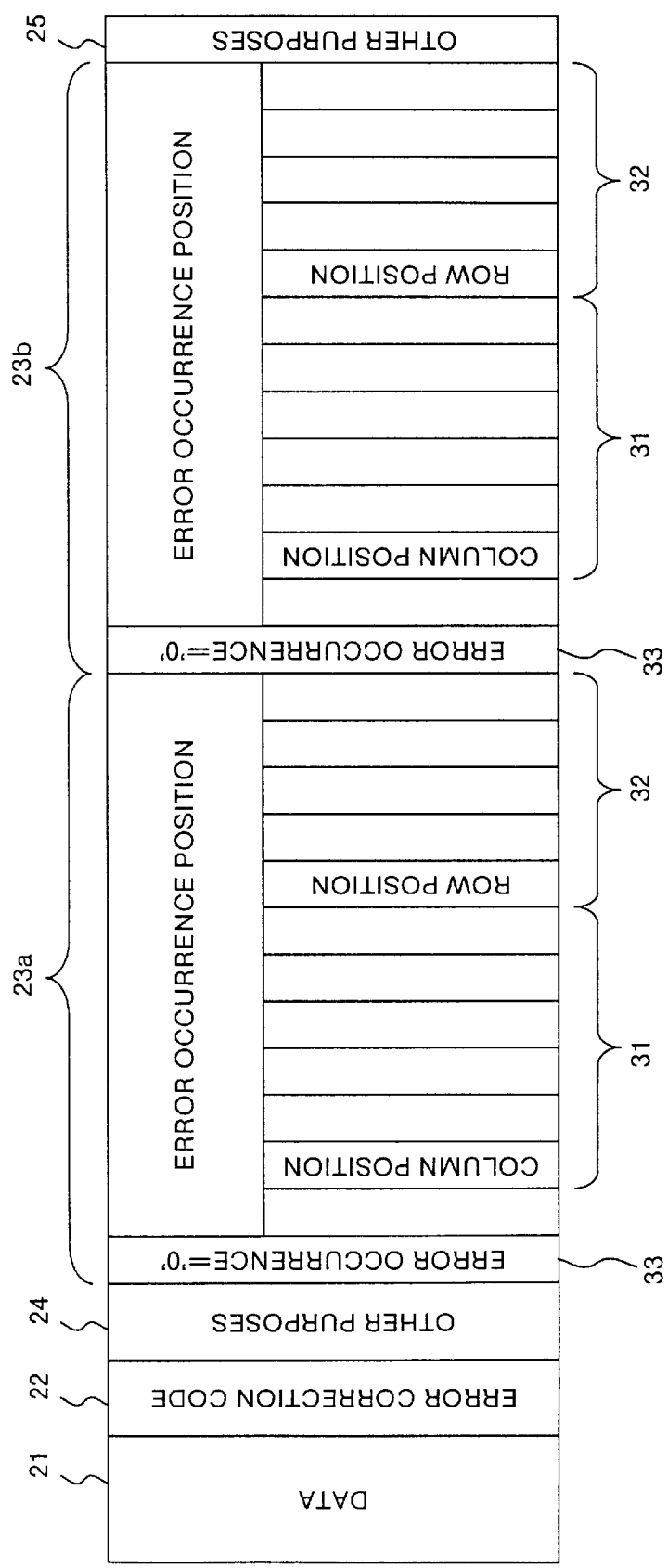
FIG. 3 is a typical view showing one example of the constitution of data stored in a physical page using the method of managing a defect in a flash memory according to the present invention.

FIG. 3 is a typical view showing one example of the constitution of data stored in a physical page using the method of managing a defect in a flash memory according to the present invention. Reference numeral 21 denotes a field for storing actual data, reference numeral 22 denotes a field for storing the error correction code, reference characters 23a and 23b denote error management units, reference numeral and 24 and 25 denote fields used for the other purposes. The error correction code generated by the error correction code generation circuit 14 in programming is stored in the error correction code field 22.

Each of the error management units 23a and 23b corresponds to the above-stated management information storage area and includes a column position field 31, a row position field 32, and an error occurrence field 33. The column position field 31 stores information for specifying the column position of a bit to which an error occurred. The row position field 32 stores information for specifying the row position of the bit to which the error occurred. The error occurrence field 33 stores a flag indicating whether or not the information on the column position and the row position stored in the error management units 23a and 23b are effective.

If a value stored in the error occurrence field 33 of the error management unit 23a is, for example, "0" (zero), it means that the information stored in the column position field 31 and that stored in the row position filed 32 of the error management unit 23a are effective information for specifying the position at which the error has occurred. If a value stored in the error occurrence field 33 is "1", it means that the information stored in the error management unit 23a is of no special significance. Although it is mentioned here, that the information stored in the column position field 31 and the row position filed 32 is taken as effective when the value stored in the error occurrence field 33 is "0", and non-effective when value stored in the error occurrence field 33 is "1", there is no particular limitation. For example, the information stored in the column position field 31 and the row position filed 32 may be taken as effective when the value stored in the error occurrence field 33 is "1", and non-effective when value stored in the error occurrence field 33 is "0".

Each of the error management units 23a and 23b stores 1-bit information regarding at which position the error has occurred ("error occurrence position"). Therefore, if the error correction capability of the error correction codes is 1 bit, one error management unit is prepared in the redundant portion of the physical page. If the error correction capability of the error correction code is 2 bits, as shown in FIG. 3, a maximum of two error management units 23a and 23b are prepared. Namely, it is enough to prepare the maximum number of error management units in one physical page equal to the number of bits for which error can be corrected. Therefore, if the error correction capability of the error correction code is 3 bits, one, two or three error management units may be prepared.

Figure 4:
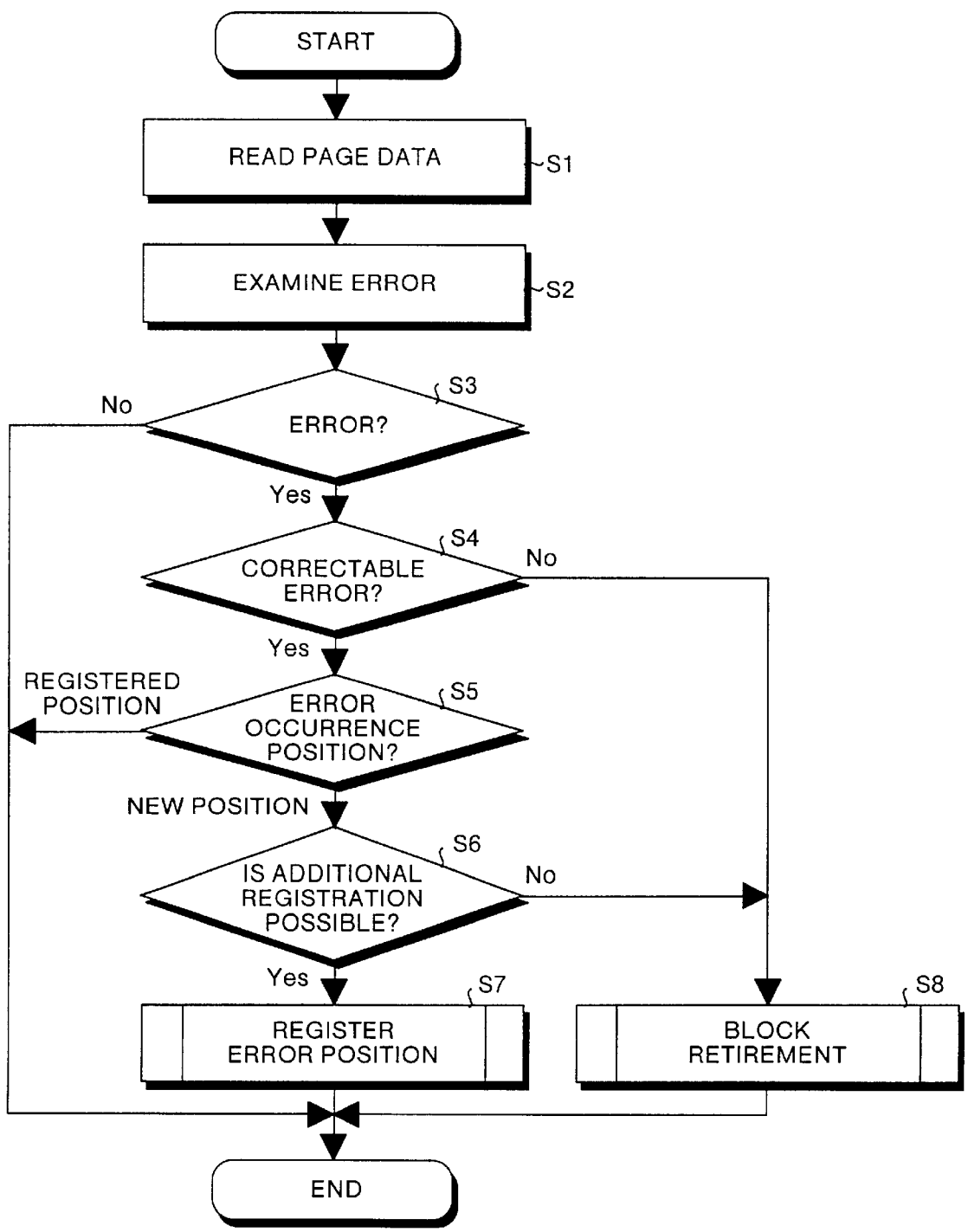
FIG. 4 is a flowchart showing one example of the method of managing a defect in a flash memory according to the present invention.

FIG. 4 is one example of a flowchart showing the method of managing a defect in a flash memory according to the present invention. When data reading from the storage device 1 starts, the storage device 1 is instructed, through the host bus 2, to read a physical page. The address control circuit 12 selects the flash memory 15a in which the to-be-read physical page exists, and outputs a chip enable signal CE to the selected flash memory. The address control circuit 12 also sends a data pattern corresponding to a command for reading the physical page to the flash memory 15a through the data control circuit 13 and the memory bus 16.

The flash memory 15a, that is selected based on the chip enable signal CE through the memory bus 16 and that receives the physical page read command, outputs appropriate physical page data to the data control circuit 13. At this time, in addition to outputting actual data in the corresponding physical page, an error correction code stored in the error correction code field 22 is also output (step S1). This error correction code is has been written in the error correction code field 22 when the actual data is written to the physical page.

The data control circuit 13 receives the actual data and the error correction code and allows the error correction code generation circuit 14 to generate an error correction code corresponding to the actual data, i.e. , a comparison target code. The data control circuit 13 then compares the comparison target code with the error correction code received along with the actual data and thereby examines whether or not an error has occurred (step S2).

If the result of error examination indicates that an error has not occur ("No" instep S3), the data control circuit 13 supplies the actual data to the host system through the host bus 2, and the operation of data reading ends there. On the other hand, if the result of error examination in step S3 indicates that an error has occurred ("Yes" in step S3), the data control circuit 13 judges whether or not the error is correctable (step S4).

If the error is an uncorrectable error ("No" in step S4), the data control circuit 13 judges that a physical block including the physical page, to which the error has occurred, cannot be used and eliminates the physical page from an usable area (step S8). Moreover, the data control circuit 13 notifies the host system, through the host bus 2, that an uncorrectable error has occurred and finishes data read.

If the judgment in step S4 shows that the error is a correctable error ("Yes" in step S4), the data control circuit 13 specifies a position where exactly the error has occurred. The data control circuit 13 compares information related to the position where exactly the error has occurred with the information already stored in the column position field 31 and the row position field 32 included in each of the error management units 23a and 23b of the corresponding physical page (step S5).

Precisely, the data control circuit 13 checks whether the position where exactly the error has occurred coincides with the information stored in the column position field 31 and the row position field 32 of either the error management unit 23a or 23b of the corresponding physical page. In other words, the data control circuit 13 checks whether the position where exactly the error has occurred has already been registered. If the result of such checking indicates that the position where exactly the error has occurred has already been registered ("registered position" instep S5) the data control circuit 13 corrects the error of the actual data (to which the error occurred) read from the physical page using the error correction code read from the error correction code field 22. The data control circuit 13 supplies the data that has been error corrected to the host system. The data control circuit 13 also notifies the host system that a correctable error has occurred. The operation of data reading ends there.

However, if the result of checking at step S5 indicates that the position where exactly the error has occurred has not been registered ("new position" in step S5), then the data control circuit 13 judges whether or not there is a space for registering this position in the error management unit 23a or 23b of the corresponding physical page (step S6). If the it is judged that there is no space in the error management units 23a and 23b for registering the new position ("No" in step S6), the data control circuit 13 judges that the physical block including the physical page to which the error occurred cannot be used and eliminates the physical block from the usable area (step S8).

In this case, although the error correction code has, for example, a 2-bit error correction capability, when there is no space in the error management units for registering the new position, it means that an error has occurred to the third bit in the same physical page. In other words, such a physical page has a high probability that the number of errors will exceed the correction capability (i.e. 2 bits) of the error correction code in the future. Therefore, such a physical page is eliminated.

On the other hand, if it is judged in step S6 that there is a space in the error management units for registering the new position ("Yes" in step S6), then the data control circuit 13 registers the column position information and row position information related to this position in the error management unit 23a (or 23b) of the corresponding physical page (step S7). The data control circuit 13 supplies the actual data that has been error corrected to the host system. Moreover, the data control circuit 13 notifies the host system that a correctable error had occurred. The operation of data reading ends there.

Figure 5:
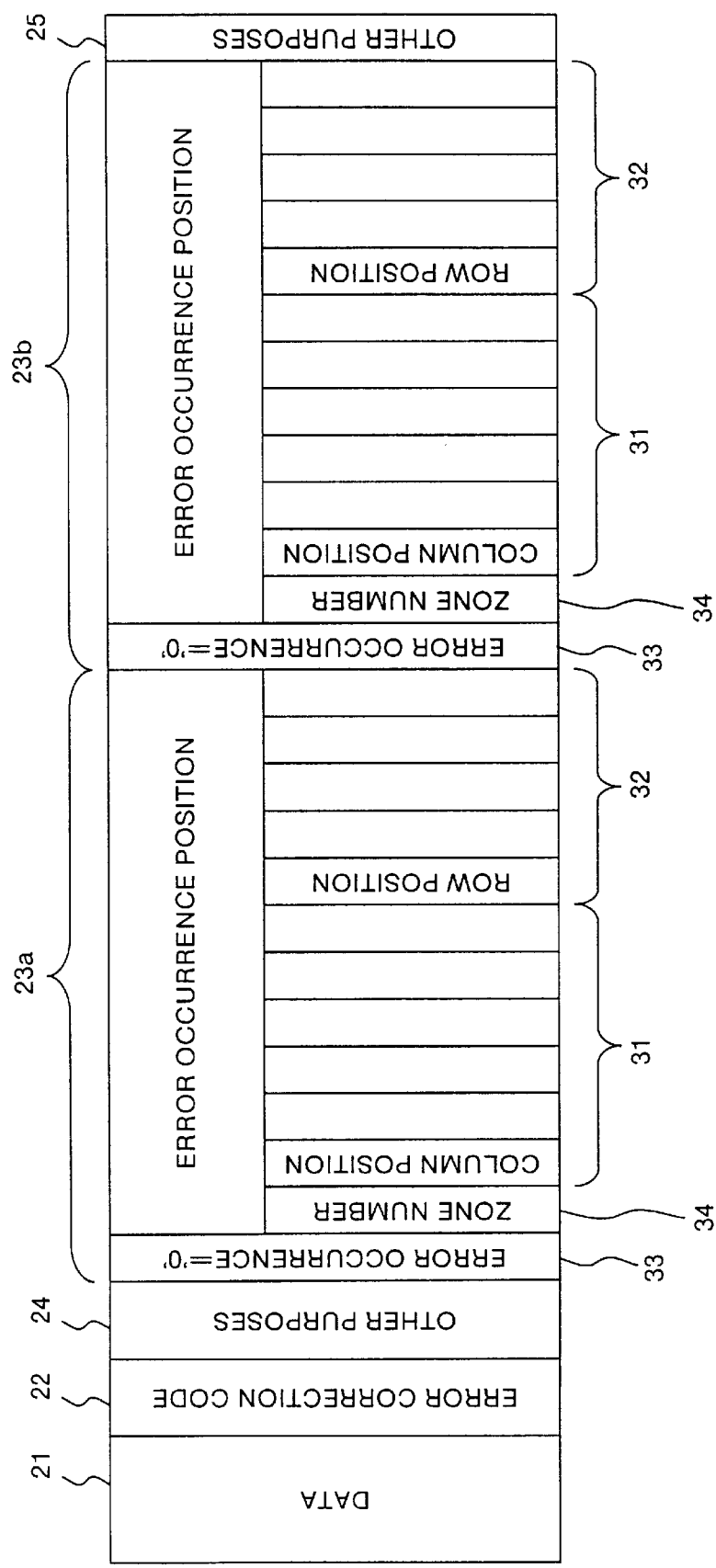
FIG. 5 is a typical view showing another example of the constitution of data stored in a physical page using the method of managing a defect in a flash memory according to the present invention.

FIG. 5 is a typical view showing another example of the constitution of data stored in a physical page using the method of managing a defect in a flash memory according to the present invention. This data constitution is used if the flash memory consists of multi valued cells in each of which information of multi-bits can be stored. The data constitution shown in FIG. 5 differs from that shown in FIG. 3 in that each of the error management units 23a and 23b is provided with a zone number field 34. The remaining constituent elements are the same as those in the data constitution shown in FIG. 3. Therefore, the same constituent elements as those in FIG. 3 are denoted by the same reference numerals or characters and description thereof will be skipped.

A zone number is stored in the zone number field 34. This zone number is information for managing an error occurrence position in units of memory cells and that different zone numbers are allotted to the respective memory cells.

Accordingly, a plurality of bits stored in the same memory cell will have the same zone number. If an error occurs, the error occurrence position is specified by the zone number.

Assume, for example, that 2-bits error has occurred to a certain physical page in the storage device capable of storing 2-bit data in a single memory cell. Then, as in case of the defect example 1 shown in FIG. 6, the bits will have the same zone number (i.e. "0") corresponding to the positions of bits to which the error has occurred (i.e. "0" and "1"). On the other hand, as in case of the defect example 2 shown in FIG. 6, the bits will have different zone numbers (i.e. "0" and "1") corresponding to the positions of the bits to which the error has occurred (i.e. "1" and "2".

Assume that a function for correcting 2 bits errors per physical page is provided. In this case, if the 2-bit error that has occurred is a correctable one, then the error can be corrected using the error correction code in both the defect examples 1 and 2. No problem arises in case of the defect example 1. However, in case of the defect example 2, it is recognized that the data holding characteristics of the two memory cells (having zone numbers "0" and "1") degrade. Thus, there is a probability that errors occur to up to 4 bits in the future.

Accordingly, if error has occurred to memory cells having different zone numbers as in case of the defect example 2, the data control circuit 13 judges that a physical block including the physical page, to which the error has occurred, cannot be used as in the above-stated case where an uncorrectable error has occurred. In this case the data control circuit 13 eliminates such a physical page from the usable area and notifies the host system that an uncorrectable error has occurred. On the other hand, if the error has occurred to bits having the same zone number as in case of the defect example 1, the data control circuit 13 registers the position where the error has occurred if the error management unit 23a or 23b has a space for registering such a positions and notifies the host system that a correctable error had occurred.

According to the above-explained embodiment, the error management units 23a and 23b for storing physical occurrence positional information on errors are prepared. The number of such error management units is equal to two, that is equal to the number of bits which can be corrected using the error correction code. If the number of physical positions at which errors have occurred to the same physical page exceeds the number of the prepared error management units, then it is judged that uncorrectable error has occurred and the use of a physical block including such a physical page is prohibited. Thus, it is possible to judge more accurately whether or not a physical block can be used.

Further, in case the flash memory consists of multi valued cells, and if the total number of bits included in a memory cell corresponding to a plurality of errors which occurred in the same physical page exceeds the number of the prepared error management units, then it is judged that an uncorrectable error has occurred and the use of a physical block including such a physical page is prohibited. This is because, there is a high probability in the future that the number of errors which may occur will exceed the number of errors which can be corrected using the error correction code. Thus, it is possible to judge more accurately whether or not the physical block can be used.

A case has been explained where the error correction code has a 2-bit correction capability. However, the present invention should not be limited to this case. In other words, this invention is also applicable to a case where the error correction code has a correction capability of 3 bits or more.

Furthermore, as an example of a multi valued cell, it has been explained above that 2-bit information can be stored in the same memory cell. However, this invention is also applicable to a case where information of 3 bits or more can be stored in the same memory cell. Similarly, the number of error management units provided in one physical page may be smaller than the number of bits which can be corrected using the error correction code.

Furthermore, according to the above-stated embodiment, zone numbers have been specified in the example of a multi valued cell. However, the present invention should not be limited to this case. It is also possible to judge whether bits to which errors occurred, are included in the same memory cell or spread over two memory cells or more based on the number of bits stored in the same memory cell. In this case, there is no need to provide the zone numbers, and also it is not necessary to provide the zone number field in the physical page.

According to the present invention, it is judged whether errors which occurred to the same physical page are correctable or uncorrectable based on physical positional information on the errors, the number of bits which can be corrected using the error correction code, and the number of bits which can be stored in one memory cell. Moreover, if the errors are uncorrectable, then the use of a physical block including such a physical page is prohibited. Thus, it is possible to judge more accurately whether or not a physical block can be used.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of managing a defect in a flash memory, said flash memory storing 1-bit information in a single cell, the method comprising the steps of:

deciding whether an error has occurred, and if the error has occurred, deciding a number of errors occurring in a one physical page;

deciding whether a number of memory cells corresponding to a plurality of bits to which the error has occurred in said one physical page exceeds a predetermined number that is equal to or smaller than the number of bits which can be corrected using an error correction code; and prohibiting use of a physical block including said one physical page for which it is decided that the number of memory cells exceeds the predetermined number.

2. The method according to claim 1, further comprising the step of storing information indicating physical positions of the bits, to which the error has occurred, together with actual data, in a redundant portion of said physical page.

3. The method according to claim 2, further comprising the steps of:

checking, if an error has occurred during data reading, whether information on a physical position of a bit to which the error occurred is coincident with the information stored in said redundant portion of said physical page, wherein the information on the physical position is an information indicating a physical position of the bit to which the error occurred; and judging that the error can be corrected using the error correction code if the information on the physical position coincides with the information stored in said redundant portion of said physical page.

4. The method according to claim 2, further comprising the steps of:
   checking, if a new error has occurred during data reading, whether there is space in said redundant portion of said physical page for storing an information on a physical position of a bit to which the error has occurred;
   if it is decided that there is space in said redundant portion, then storing the information on a physical position of a bit to which the error has occurred in said redundant portion, and judging that the error can be corrected using the error correction code.

5. The method according to claim 2, further comprising the steps of:
   checking, if a new error has occurred during data reading, whether there is space in said redundant portion of said physical page for storing an information on a physical position of a bit to which the error has occurred;
   if it is decided that there is no space in said redundant portion, then judging that un unrecoverable defect has been generated, and prohibiting use of said physical block including said physical page.

* * * * *